United States Patent [19]

Sato et al.

[11] 4,021,752
[45] May 3, 1977

[54] PHASE LOCKED LOOP FOR USE WITH LOCAL OSCILLATOR

[75] Inventors: Teruo Sato, Kanagawa; Nobuharu Michihata, Tokyo, both of Japan

[73] Assignee: Sony Corporation, Tokyo, Japan

[22] Filed: Mar. 11, 1976

[21] Appl. No.: 665,970

[30] Foreign Application Priority Data

Mar. 13, 1975 Japan .............................. 50-30388

[52] U.S. Cl. ................................. 331/17; 325/407;
325/419; 325/421; 311/11
[51] Int. Cl.² ......................................... H03B 3/04
[58] Field of Search .................... 331/17, 15, 11;
325/407, 417, 418, 419, 420, 423

[56] References Cited

UNITED STATES PATENTS

| | | | |
|---|---|---|---|
| 3,209,271 | 9/1965 | Smith | 325/417 |
| 3,223,943 | 12/1965 | Dumaire et al. | 331/17 |
| 3,231,822 | 1/1966 | Tillotson | 325/417 |
| 3,286,191 | 11/1966 | Cornwell | 331/11 |
| 3,328,719 | 6/1967 | Lisle et al. | 331/17 |
| 3,510,779 | 5/1970 | Klapper | 325/420 |

*Primary Examiner*—John Kominski
*Attorney, Agent, or Firm*—Lewis H. Eslinger; Alvin Sinderbrand

[57] ABSTRACT

A phase locked loop for use with a local oscillator includes a reference signal oscillator, a local oscillator the frequency of which is changed within a predetermined frequency range and a phase comparator for comparing output signals from the reference oscillator and the local oscillator. A low pass filter and a DC amplifier form a phase locked loop with the reference signal oscillator, local oscillator, and phase comparator. The gain of the DC amplifier is controlled in response to the frequency of the local oscillator so as to make its loop gain substantially constant. In accordance with one example of the invention, an FM feedback circuit is provided between the demodulated output side and the input side of the DC amplifier so as to improve the sensitivity of a receiver using the local oscillator.

9 Claims, 3 Drawing Figures

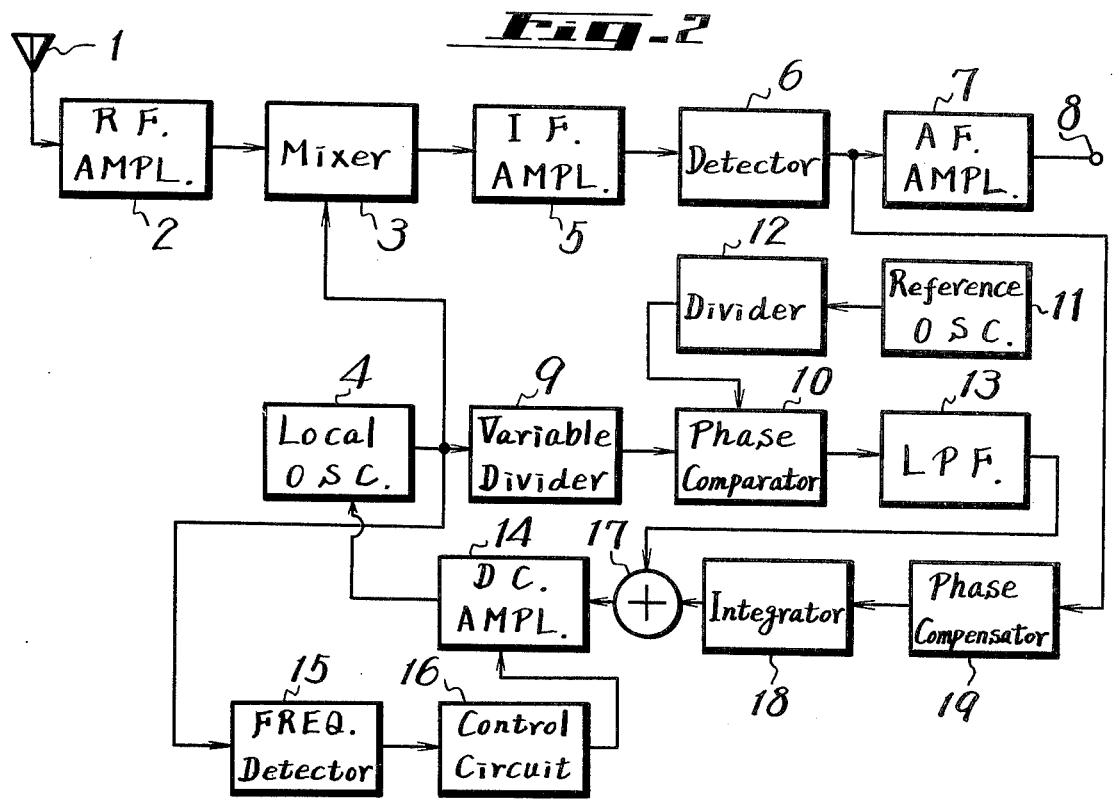
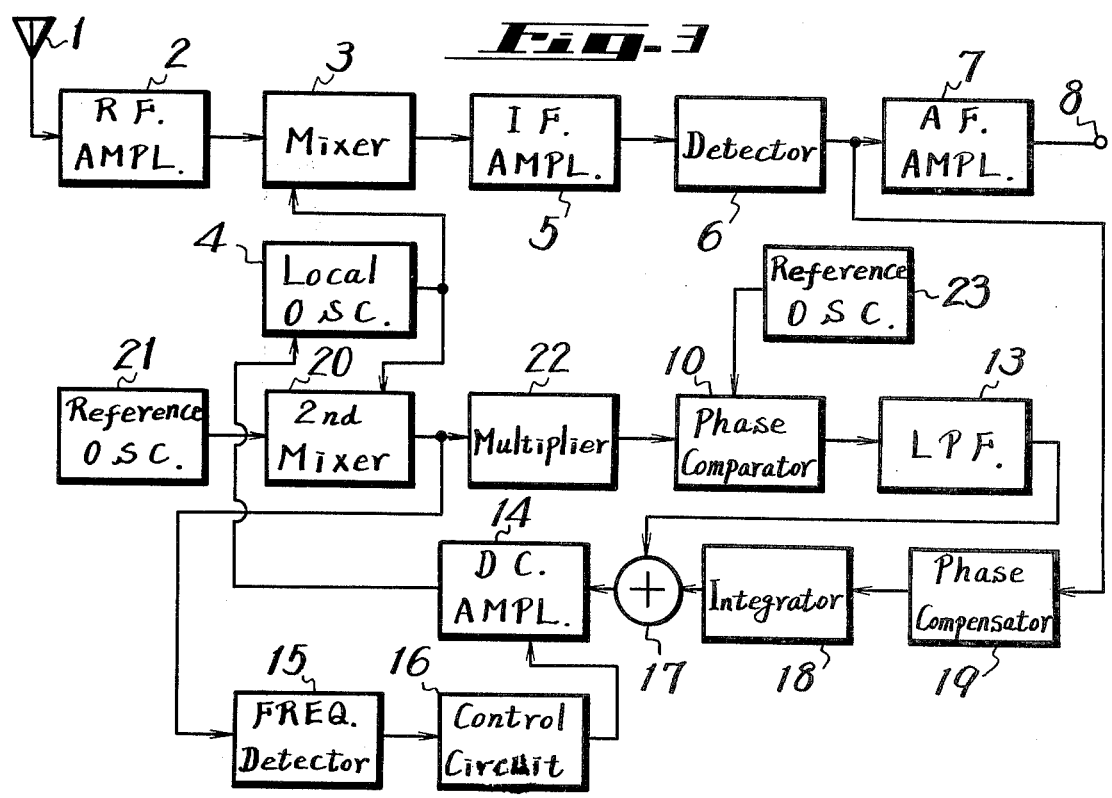

PHASE LOCKED LOOP FOR USE WITH LOCAL OSCILLATOR

BACKGROUND OF THE INVENTION

1. Field of the Invention

The present invention relates generally to a phase locked loop (PLL) for use with a local oscillator, and more particularly to a PLL which was provided with a loop gain control circuit and a frequency modulated (FM) feedback circuit.

2. Description of the Prior Art

In the art, the frequency of a local oscillator used in a receiver is synchronized in phase with the reference frequency of a reference oscillator, such as a quartz oscillator or the like. In order to vary the frequency of the local oscillator, a variable frequency divider is used, which is varied in response to the frequency of a received signal to provide a predetermined frequency band or range.

In general, the frequency stability of a PLL is determined by its loop gain, which is determined by the phase conversion gain of the phase comparator and the frequency conversion gain of a voltage controlled oscillator (VCO) in the PLL that uses a variable frequency divider so as to vary the frequency of a local oscillator, the loop gain thereof is varied by the frequency dividing ratio 1/N. It is known in the art that in order to cover a predetermined frequency band, the frequency dividing ratio increases with the frequency of the local oscillator and, hence, the loop gain of the PLL becomes lower than at low frequencies.

Further, the harmonic locking method in which no variable frequency divider is employed and the frequency of the local oscillator is phase-locked to harmonics of the reference oscillator is disclosed in the IEEE Spectrum March, 1971, page 42. In that case, the loop gain is also lowered at high frequencies of the local oscillator.

However, it has not been proposed heretofore to make the loop gain of a Pll substantially constant over the frequency band of the local oscillator.

In the art an FM feedback method has been known in which a negative feedback signal is supplied from the output of a frequency discriminator to a local oscillator to improve the sensitivity of a receiver. However, it has not been proposed previously to produce a receiver in which a PLL circuit and the FM feedback are combined to suppress the drift in the local oscillator and to improve the sensitivity of the receiver.

OBJECTS AND SUMMARY OF THE INVENTION

Accordingly, it is an object of the invention to provide a PLL for use with a local oscillator in which the loop gain of the PLL is substantially constant within a predetermined frequency range or band of the local oscillator.

It is another object of the invention to provide a PLL for use with a local oscillator, the local oscillator, a phase comparator, a low pass filter and a DC amplifier being connected in a closed loop, a detector being provided for detecting the frequency of the local oscillator, and the gain of the DC amplifier being controlled with the output from the detector.

It is a further object of the invention to provide a PLL for use with a local oscillator in which a received signal is detected by the local oscillator and the detected output signal is partially applied to a DC amplifier through an integrator to carry out an FM feedback.

According to one aspect of the present invention, a local oscillator may be used with a PLL that comprises the local oscillator whose frequency is changed within a predetermined frequency range, a reference signal oscillator, a circuit for phase-comparing the output signals from both the local oscillator and reference oscillator, a low pass filter supplied with the output signal from the phase-comparing circuit, a DC amplifier that receives the output signal from the low pass filter and supplies an amplified signal to the local oscillator to phase-lock the local oscillator with the reference signal, a circuit for detecting the frequency of the local oscillator, and a control circuit for receiving the output signal from the detecting circuit and applying a control signal to the DC amplifier so as to control the gain thereof in response to the detected frequency.

Other objects, features and advantages of the invention will be apparent from the following description taken in conjunction with the attached drawings.

BRIEF DESCRIPTION OF THE DRAWINGS

FIGS. 2 and 3 are block diagrams showing other examples of the invention.

DESCRIPTION OF THE PREFERRED EMBODIMENTS

Figure 1:
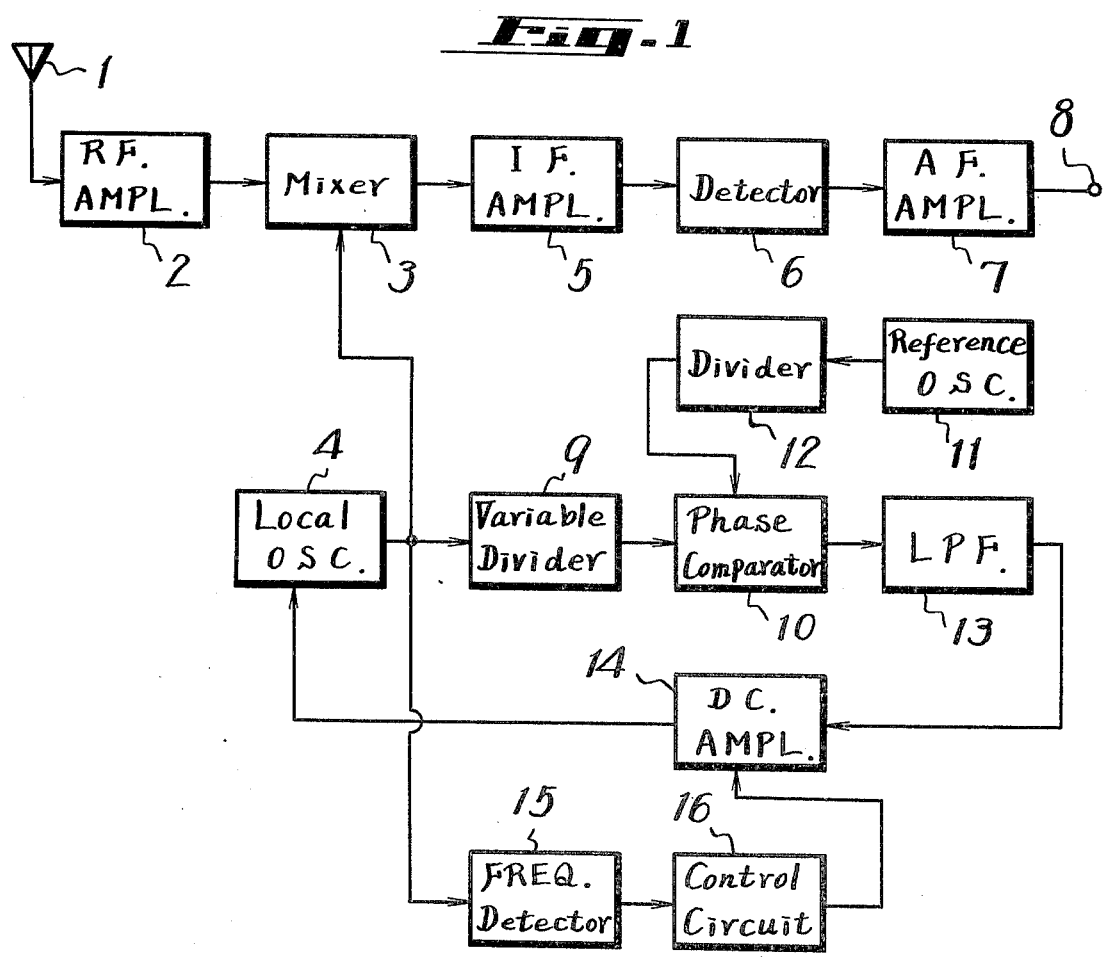
FIG. 1 is a block diagram of one example of a circuit according to the present invention.

FIG. 1 shows one embodiment of a receiver circuit that includes a PLL according to the invention. The circuit includes an antenna 1 for receiving radio frequency (RF) signals, an RF amplifier 2 which selects one of the signals, and a mixer 3 which is supplied with the output signal from the RF amplifier and a signal from a local oscillator 4. The mixer 3 produces an intermediate frequency (IF) signal to an IF amplifier 5, which amplifies it and applies it to a detector 6. The detected output signal from the detector 6 is delivered to an audio frequency (AF) amplifier 7 that has an output terminal 8.

In the example shown in FIG. 1, a voltage-controlled variable frequency oscillator is used as the local oscillator 4 to produce an oscillator signal in response to the frequency of the received signal and to supply that signal to the mixer 3 and to a variable frequency divider 9. The signal obtained from the variable frequency divider 9 is applied to a phase comparator 10, which also receives a signal from a reference oscillator 11 via a fixed frequency divider 12. The phase comparator 10 compares the phases of the signals from the variable frequency divider 9 and the fixed frequency divider 12 and produces a signal based on the phase difference. This signal is then applied through a low pass filter 13 to a DC amplifier 14. The output signal from the DC amplifier 14 is applied to the local oscillator 4 as a frequency-controlling signal. Thus, the oscillation frequency of the local oscillator 4 is locked at every frequency which is provided by dividing the oscillation frequency of the reference oscillator 11. For example, the frequency of a signal obtained from the reference oscillator 11 through the frequency divider 12 is 100 KHz, the signal from the variable frequency oscillator 4 can be locked at every 100KHz. This signal is supplied from the local oscillator 4 to the mixer 3 which, therefore, produces the IF signals at every other 100 KHz.

When the circuit just described, which may be called a synthesizer tuner, is constructed so as to receive FM broadcasting signals, the band of such signals in the United States is a wide band of 88 MHz to 108 MHz, and hence the frequency dividing ratio of the variable frequency divider 9 is changed at low and high frequency bands. As a result, the loop gain of the control system including the local oscillator 4 is changed. As the loop gain is changed, the lock range of the local oscillator 4 is changed at every band with the result that the stability of the tuner is reduced. Thus, there is a possibility that a receiver with such a tuner may be detuned so that it cannot perform stable reception of a signal.

However, in the embodiment shown in FIG. 1 the output signal from the local oscillator 4 is supplied to a frequency detector 15, and the signal detected by the detector 15 in response to the frequency of the local oscillator 4 is supplied to a control circuit 16. The output signal from the control circuit is applied to the DC amplifier 14 to change the gain thereof in respone to the frequency of the local oscillator 4.

With the PLL of the invention constructed as above, even if the oscillation frequency of the local oscillator 4 is varied over a wide range, the oscillation frequency of the local oscillator 4 is detected by the detector 15 and the gain of the DC amplifier 14 is controlled by the control circuit 16 in response to the detected frequency, so that the loop gain can be made always constant. Accordingly, since the loop gain is always constant, the lock range of the receiver is always constant and hence the receiver can receive signals stably over a wide range from a low frequency band to a high frequency band.

FIG. 2 shows another example of the invention in which the lock range can be made constant by making the loop gain constant and the sensitivity of the receiver can also be made high. Reference numerals in FIG. 2 corresponding to those in FIG. 1 designate corresponding elements and hence their description will be omitted for the sake of brevity.

In the example of FIG. 2, the detected output signal from the detector 6 and the output signal from the low pass filter 13 are combined and supplied through the DC amplifier 14 to the local oscillator 4, and the output signal from the local oscillator 4 is fed to the mixer 3, so that a feedback signal is applied thereto. The signals from the detector 6 and the filter 13 are combined in an adder 17, and the output signal from the adder 17 is amplified by the DC amplifier 14 and applied to the local oscillator 4.

If the signal $e_1$ from the reference oscillator 11 to the phase comparator 10 is taken as $$e_1 = E_1 \sin(\omega_1 t + \phi_1) \qquad (1)$$

the signal $e_2$ from the local oscillator 4 is taken as $$e_2 = E_2 \sin \omega_2 t \qquad (2)$$

and the signal $e_3$ from the detector 6 is taken as $$e_3 = E_3 \sin\omega_3 t \qquad (3)$$

the phase variation $\theta(t)$ of the signal from the variable frequency local oscillator 4 is expressed as follows:

$$\theta(t) = \omega_1 t + \frac{\omega_2 - \omega_1}{K_1} \phi_1 + \frac{K_M E_3}{2j(j\omega_3 + KF(j\omega_3))} \epsilon^{j\omega_3 t} - \frac{K_M E_3}{2j(-j\omega_3 + K_1 F(-j\omega_3))} \epsilon^{-j\omega_3 t} \qquad (4)$$

where:

$\omega_2$ is the self oscillation frequency of the variable frequency oscillator;

$K_M$ is the FM (frequency modulation) sensitivity of the variable frequency oscillator;

$F(p)$ is the transfer function of the low pass filter;

$K_1 = E_1 K_D K_M$; and $K_D$ is the conversion sensitivity of the phase comparator.

If the low pass filter 13 has a sufficiently wide band and the factor $K_1$ is sufficiently great, the following conditions are established:

$$[K_1 F(j\omega_3)] >> \omega_3 \qquad (5)$$

$$F(j\omega_3) \approx 1 \qquad (6)$$

Equation (3) can be rewritten as follows:

$$\begin{aligned}\theta(t) &= \omega_1 t + \frac{\omega_2 - \omega_1}{K_1} + \phi_1 + \frac{K_M E_3}{2jK_1} \epsilon^{j\omega_3 t} - \frac{K_M E_3}{2jK_1} \epsilon^{-j\omega_3 t} \\&= \omega_1 t + \frac{\omega_2 - \omega_1}{K_1} + \phi_1 + \frac{K_M E_3}{K_1} \cdot \frac{1}{2j}(\epsilon^{j\omega_3 t} - \epsilon^{-j\omega_3 t}) \\&= \omega_1 t + \frac{\omega_2 - \omega_1}{K_1} + \phi_1 + \frac{K_M E_3}{K_1} \sin \omega_3 t \qquad (7)\end{aligned}$$

That is, the factor of sin $_3t$ has no direct relations to $_3$ and hence the phase variation $\theta(t)$ is a phase modulation one.

Accordingly, in order to convert $\theta(t)$ to a frequency modulated signal, the output signal from the detector 6 is supplied to the adder 17 through an integrator 18 in the embodiment in FIG. 2. A phase corrector, or compensator 19 compensates for the phase delay caused by the RF amplifier 2, mixer 3, IF amplifier 5, and integrator 18.

With the embodiment shown in FIG. 2, the output signal from the detector 6 is supplied through the integrator 18 and the DC amplifier 14 to the local oscillator 4, and the frequency modulated signal from the local oscillator 4 is supplied to the mixer to apply, in effect, negative feedback thereto. In this case, the negative feedback causes the modulation index to become small for the input signal, and accordingly the pass band of the IF amplifier 5 can be made narrow so that the sensitivity of the receiver can be improved.

With the example of FIG. 2, since the loop gain can be always maintained constant irrespective of the frequency, the amplitude of the signal fed back can be made approximately constant irrespective of the frequency.

FIG. 3 shows a third embodiment in which the PLL of the invention is applied to a stereophonic receiver. The elements in FIG. 3 corresponding to those in FIGS. 1 and 2 are shown with the corresponding reference numerals and their description will be omitted as reduntant.

In the embodiment in FIG. 3, a second mixer 20 is provided in addition to the mixer 3, and a reference oscillator 21 having a fixed frequency is also provided. The second mixer 20 is supplied with the signal from the local oscillator 4 as well as the signal from the reference oscillator 21. Thus, the mixer 20 produces a signal of low frequency which is then applied through a frequency doubler 22 to the phase comparator 10 which is also supplied with a signal of, for example, 200KHz from a reference oscillator 23. The phase comparated output signal from the phase comparator 10 is supplied through the low pass filter 13 and so on to the adder 17. The remainder of the circuit in FIG. 3 is substantially the same as that of FIG. 2, so that a description thereof is unnecessary.

With the example shown in FIG. 3, the frequency $f_o$ of the local oscillator 4 is $f_r + m \cdot 100(KHz)$ where $f_r$ is the oscillation frequency of the reference oscillator 21 and $m$ is the harmonic number of the harmonics from the reference oscillator 23, so that the local oscillator 4 is locked at every 100 KHz. Therefore, it will be easily understood that the same effects as those of the examples shown in FIGS. 1 and 2 can be achieved.

It will be apparent that many modifications and variations could be effected by one skilled in the art without departing from the spirit or scope of the novel concepts of the present invention, so that the scope of the invention should be determined by the appended claims only.

We claim as our invention

1. A circuit comprising:
   a. a local oscillator the frequency of which is changed within a predetermined frequency range;
   b. a reference signal oscillator;
   c. means for phase comparing output signals from said reference oscillator and said local oscillator;
   d. a low pass filter supplied with the output signal from said phase comparing means;
   e. a DC amplifier for receiving the output signal from said low pass filter and supplying its amplified DC signal to said local oscillator so as to phase-lock the local oscillator signal with said reference signal;
   f. means for detecting the frequency of said local oscillator; and
   g. control means for receiving the output signal from said detecting means and applying a control signal to said DC amplifier so as to control the gain of said DC amplifier in response to the detected frequency.

2. A circuit according to claim 1, further comprising a variable divider connected between said local oscillator and said phase comparing means to the frequency of said local oscillator.

3. A circuit according to claim 2, further comprising:
   a. means for receiving a frequency modulated signal;
   b. mixing means supplied with the received frequency modulated signal and the output signal of said local oscillator to convert them to an intermediate frequency signal;
   c. means for demodulating said intermediate frequency signal; and
   d. means for feeding back one part of the output of said demodulating means to the input of said DC amplifier to provide an FM feedback circuit.

4. A circuit according to claim 3 comprising an integrator, said one part of the output signal being applied to the input of said DC amplifier through said integrator.

5. A circuit comprising:
   a. a local oscillator the frequency of which is changed within a predetermined frequency range;
   b. a first reference signal oscillator;
   c. mixing means supplied with output signals from said first reference signal oscillator and said local oscillator;
   d. a second reference signal oscillator;
   e. means for phase comparing output signals from said second reference oscillator and said mixing means;
   f. a low pass filter and a DC amplifier connected in series between the output of said phase comparing means and an input of said local oscillator;
   g. means for detecting the frequency of said local oscillator;
   h. control means for receiving the output signal from said detecting means and applying a control signal to said DC amplifier so as to conrol the gain thereof in response to the detected frequency.

6. A circuit according to claim 5 further comprising a multiplier connected between the output of said mixing means and an input of said phase comparing means.

7. A circuit according to claim 6 in which the freqency ($fo$) of said local oscillator is determined by the following equation.

$$fo = fr1 + m \cdot fr2$$

where $fr1$ indicates the frequency of said first reference signal, $fr2$ indicates the frequency of said second reference signal and $m$ indicates the harmonic number of said second reference signal frequency.

8. A circuit according to claim 7 further comprising:
   a. means for receiving a freqency modulated signal;
   b. another means supplied with the received frequency modulated signal and the output signal from said local oscillator so as to convert them to a corresponding intermediate frequency signal;
   c. means for demodulating said intermediate frequency signal; and
   d. means for feeding back one part of said demodulated signal to the input of said DC amplifier to provide an FM feedback circuit.

9. A circuit acording to claim 8 in which said feedback means comprises a phase compensator and an integrator which are connected in series between the output of said demodulating means and the input of said DC amplifier.

* * * * *